United States Patent
Huang et al.

(10) Patent No.: US 7,507,353 B2
(45) Date of Patent: Mar. 24, 2009

(54) RED PHOSPHOR FOR WHITE LIGHT EMITTING DIODES

(75) Inventors: Wen-Yen Huang, Tainan (TW); Ru-Si Liu, Jhudong Township, Hsinchu County (TW); Jenq-Yang Chang, Taipei (TW)

(73) Assignee: National Central University, Jhongli (TW)

( * ) Notice: Subject to any disclaimer, the term of this patent is extended or adjusted under 35 U.S.C. 154(b) by 240 days.

(21) Appl. No.: 11/448,883

(22) Filed: Jun. 8, 2006

(65) Prior Publication Data
US 2007/0114495 A1    May 24, 2007

(30) Foreign Application Priority Data
Nov. 23, 2005    (TW) .................... 094141184

(51) Int. Cl.
*C09K 11/68*    (2006.01)
(52) U.S. Cl. .............................................. 252/301.4 R
(58) Field of Classification Search ........... 252/301.4 R
See application file for complete search history.

*Primary Examiner*—C. Melissa Koslow
(74) *Attorney, Agent, or Firm*—Troxell Law Office PLLC

(57) ABSTRACT

A phosphor can be excited by light emitting diode (LED) to emit a red light. The phosphor has high emission efficiency. Owing to a sensitizer is used in the phosphor, the phosphor can be excited at the wavelength of 380–400 nm. Moreover, the excitation efficiency of the wavelength shorter than 370 nm can be increased. The phosphor has a chemical formula of $A_{1-x-y-z}Bi_xB_yC_zMoO_4$.

7 Claims, 5 Drawing Sheets

RED PHOSPHOR FOR WHITE LIGHT EMITTING DIODES

FIELD OF THE INVENTION

The present invention relates to a phosphor; more particularly, relates to emitting a red light having a main wavelength of 612 nanometers obtained by exciting the phosphor through a light emitting diode (LED).

DESCRIPTION OF THE RELATED ARTS

A white light is a mixture of different color lights. A white light of mixed color lights consists of at least two wavelengths of lights. For example, a human's eye simultaneously receives a red, a blue and a green lights, or receives a blue and a yellow lights, it is recognized as receiving a white light. Utilizing this phenomenon, a general white light emitting diode can be fabricated in four ways:

One LED of InGaAlP, another one of GaN and the other one of GaN are used in the first way to emit a red, a green and a blue lights by controlling currents passing through the LEDs. Because the LEDs are put in the same lamp, the lights emitted from the LEDs are mixed by the lens of the lamp; thus, a white light is obtained.

In the second way, one LED of GaN and the other one of GaP are used to emit a blue and a bright green lights by controlling currents passing through the LEDs; thus, a white light is obtained too.

But, in the above two ways, if any one of the LEDs is malfunctioned, a solid white light can not be obtained. And owing to different forward biases of the LEDs, a plurality of control circuit is required and thus the cost is high.

The third way is invented by the Nichia Chemical Co., Ltd. In Japan in 1996. A LED of GaInN is used while coordinated with a phosphor of yttrium aluminum garnet to obtain a white light. The luminescence efficiency obtained, which is 30 lumens per watt, is a little lower than the previous two ways. But, owing to only a LED is required and the coordinated phosphor is developed with a few mature technologies for fabrication, the cost is greatly reduced and merchandized products have been manufactured.

However, the second and the third ways obtain white lights according to an anaglyphic principle so that the wavelengths included in the white light is not as continuous as those in the sun light. That is, the visible light spectrum for 400 nm to 700 nm of wavelength of the light obtained after mixing the color lights is not even for different color lights and thus the color saturation is not good. Although a human eye passes these defects and conceives a white light, the color rendering is still too low to be applied to optical equipments with high precisions and inaccuracy may happen for the color of an object to be recovered. As a result, the white light obtained in the third way can only be used for a simple lightening.

The fourth way involves using an ultra violet LED coordinated with a red, a green and a blue phosphors to obtain a white light by mixing color lights emitted from the phosphors. The LED used for exciting the phosphors emits an ultra violet light, which has a stronger exciting strength than the GaN LED and has a higher transformation efficiency to obtain a stronger light. Yet, among the red, the green and the blue phosphors used, the red phosphor, such as a $Y_2O_2S:Eu$ phosphor, has a very bad transformation efficiency toward the ultra violet light. Therefore, much more amount of the red phosphor is used in an actual package to obtain a white light, which also results in dimming the light of the package.

Hence, the prior arts do not fulfill users' requests on actual use.

SUMMARY OF THE INVENTION

The main purpose of the present invention is to emit a red light having a main wavelength of 612 nanometers obtained by exciting the phosphor through a LED.

To achieve the above purpose, the present invention is a red phosphor for white light emitting diodes, where the phosphor has a chemical formula of $A_{1-x-y-z}Bi_xB_yC_zMoO_4$; A for $A_{1-x-y-z}$ is Ca, Sr or Ba; B for $B_y$ is Li, N a or K; C for $C_z$ is Eu, Sm, Ce, Mn, Ti, Mg, Zn or Tb; x is greater than 0 and not greater than 0.2; y is greater than 0 and not greater than 0.4; z is greater than 0 and not greater than 0.4; $A_{1-x-y-z}MoO_4$ is acted as a host lattice; $C_z$ is acted as an activator; and $Bi_x$ is acted as a sensitizer. Accordingly, a novel red phosphor for white light emitting diodes is obtained.

BRIEF DESCRIPTIONS OF THE DRAWINGS

The present invention will be better understood from the following detailed description of the preferred embodiment according to the present invention, taken in con junction with the accompanying drawings, in which FIG. 1 is a view showing a flow chart of the solid-state reaction for obtaining the phosphor according to the preferred embodiment of the present invention;

DESCRIPTION OF THE PREFERRED EMBODIMENT

The following description of the preferred embodiment is provided to understand the features and the structures of the present invention.

Figure 1:
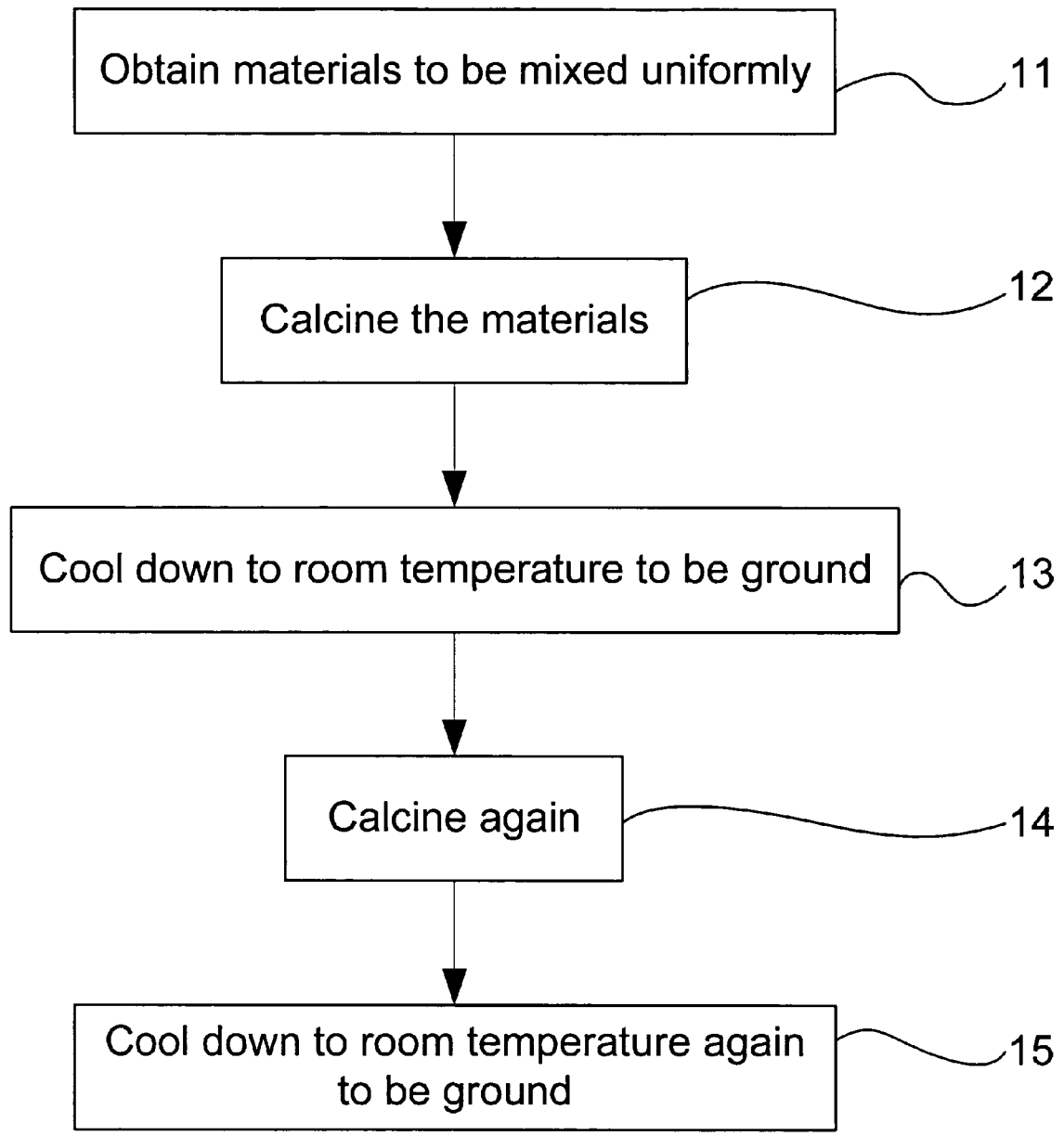

Please refer to FIG. 1, which is a view showing a flowchart of the solid-state reaction for obtaining the phosphor according to the preferred embodiment of the present invention. As shown in the figure, the present invention is a red phosphor for white light emitting diodes, where the phosphor is excited by a LED to emit a red light having a main wavelength of 612 nanometers (nm); the phosphor has a chemical formula of $A_{1-x-y-z}Bi_xB_yC_zMoO_4$; the A for $A_{1-x-y-z}$ is Ca, Sr or Ba; the B for By is Li, N a or K; the C for $C_z$ is Eu, Sm, Ce, Mn, Ti, Mg, Zn or Tb; the $A_{1-x-y-z}MoO_4$ part in the chemical formula is acted as a host lattice; the $C_z$ part is acted as an activator; the $Bi_z$ part is acted as a sensitizer; x is greater than 0 and not greater than 0.2; y is greater than 0 and not greater than 0.4; and z is greater than 0 and not greater than 0.4. The phosphor of the present invention uses the sensitizer so that the phosphor can be excited by a light source having a wavelength of 290~400 nm.

The phosphor of the present invention is obtained through a solid-state reaction or a chemical synthesis; and the chemical synthesis is a precipitation method or a citric gel method.

The phosphor of the preferred embodiment here is obtained through the solid-state reaction which comprises the following steps:

(a) Obtain materials to be mixed uniformly 11: Materials of $Eu_2O_3$, $MoO_3$, $CaCO_3$, $Li_2CO_3$ and $Bi_2O_3$ are weighed out and are ground to obtain an uniform mixture conforming to a stoichiometric ratio.

(b) Calcine the materials 12: The mixture is put into a crucible to be calcined at a temperature raising ratio of 5 Celsius degrees per minute (° C./min) until arriving at 500 Celsius degrees (° C.) to obtain a first sinter.

(c) Cool down to a room temperature to be ground 13: After four hours, the first sinter is then cooled down at a temperature lowering ratio of 5° C./min until arriving at a room temperature; then the first sinter is ground.

(d) Calcine again 14: The ground sinter is calcined again at a temperature raising ratio of 5° C./m in until arriving at 880° C. to obtain a second sinter.

(e) Cool down to room temperature again to be ground 15; After four hours, the second sinter is cooled down at a temperature lowering ratio of 5.degree.° C./min until arriving at a room temperature to be ground for obtaining the phosphor which has a chemical formula of $Ca_{0.45}Bi_{0.05}Li_{0.25}Eu_{0.25}MoO_4$.

Thus, through the above steps, a novel red phosphor for white light emitting diodes is obtained.

Figure 2:
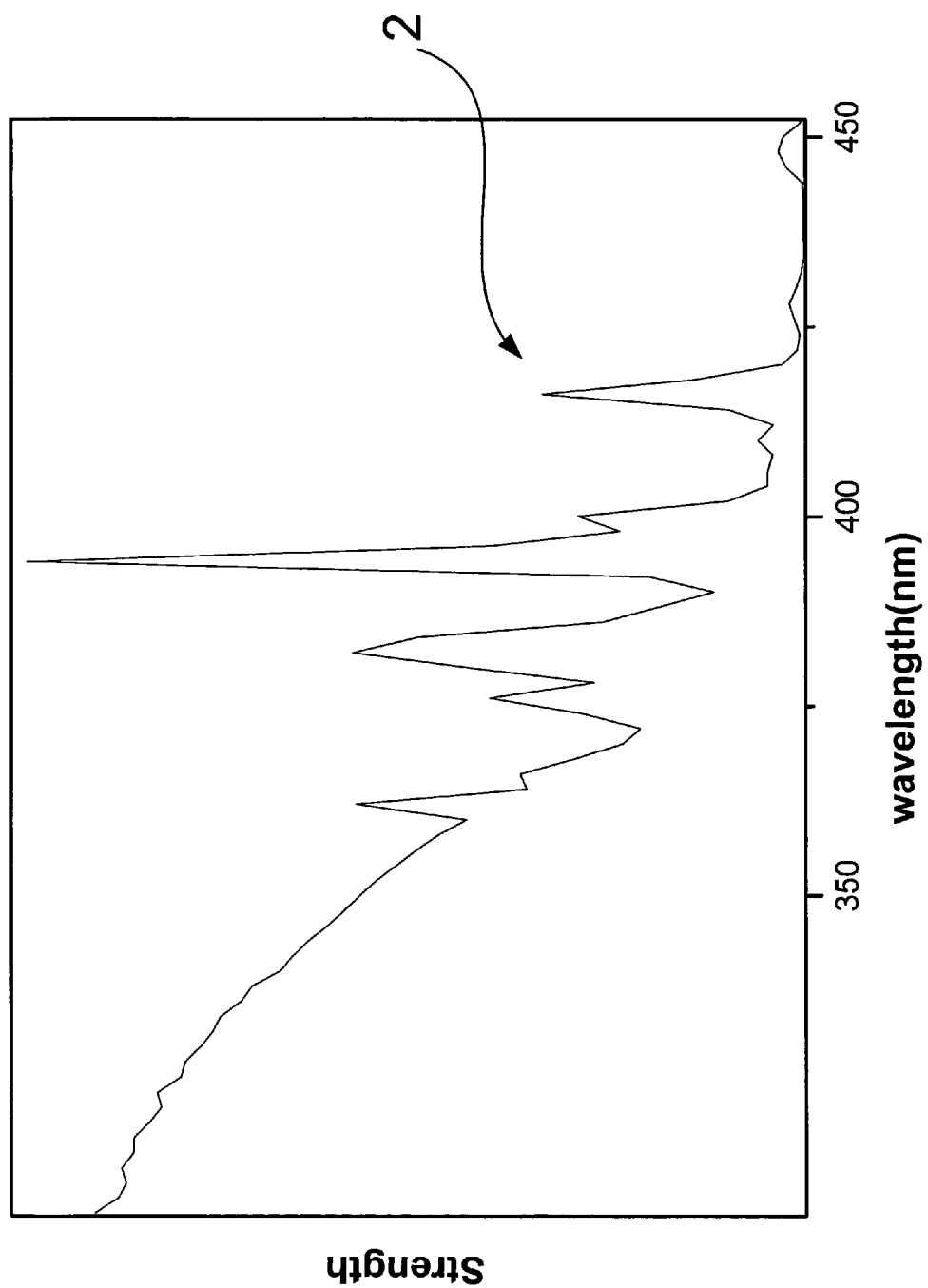
FIG. 2 is a view showing the exciting spectrum of the phosphor of the preferred embodiment.

Please refer to FIG. 2, which is a view showing the exciting spectrum of the phosphor of the preferred embodiment. As shown in the figure, the phosphor is excited by a light and an exciting spectrum 2 is obtained by using an optical emission spectrometer, where a strong absorption appears for a wavelength between 290 nm and 400 nm. Hence, the present invention is fit for excitation by a broadband of wavelength.

Figure 3:
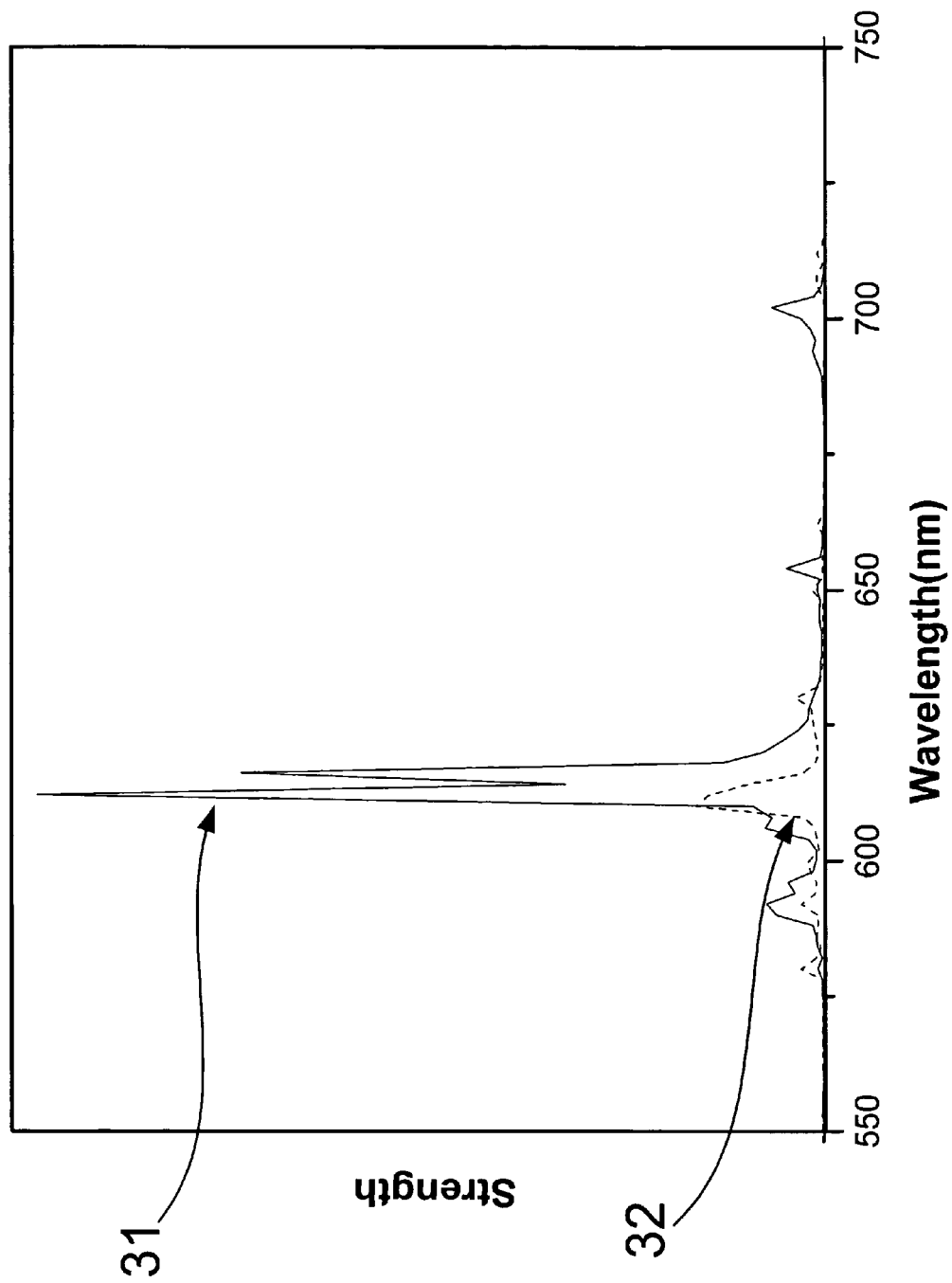
FIG. 3 is a view showing the emitting spectrums of the phosphor of the preferred embodiment and the phosphor of $Y_2O_2S:Eu$.

Please refer to FIG. 3, which is a view showing the emitting spectrums of the phosphor of the preferred embodiment and the phosphor of Y2O2S:Eu. As shown in the figure, a wavelength of 400 nm is used for excitation to obtain emitting spectrums of wavelength between 550 nm and 750 nm, where the phosphor of the preferred embodiment and a phosphor of a prior art of $Y_2O_2S$: Eu are excited to obtain a first emitting spectrum 31 for the preferred embodiment and a second emitting spectrum 32 for the prior art. In the first emitting spectrum 31, the strongest light is appeared at 612 nm, which is six times to the strongest light appeared in the second emitting spectrum 32. Thus, it shows that the present invention has an excellent luminance.

Figure 4:
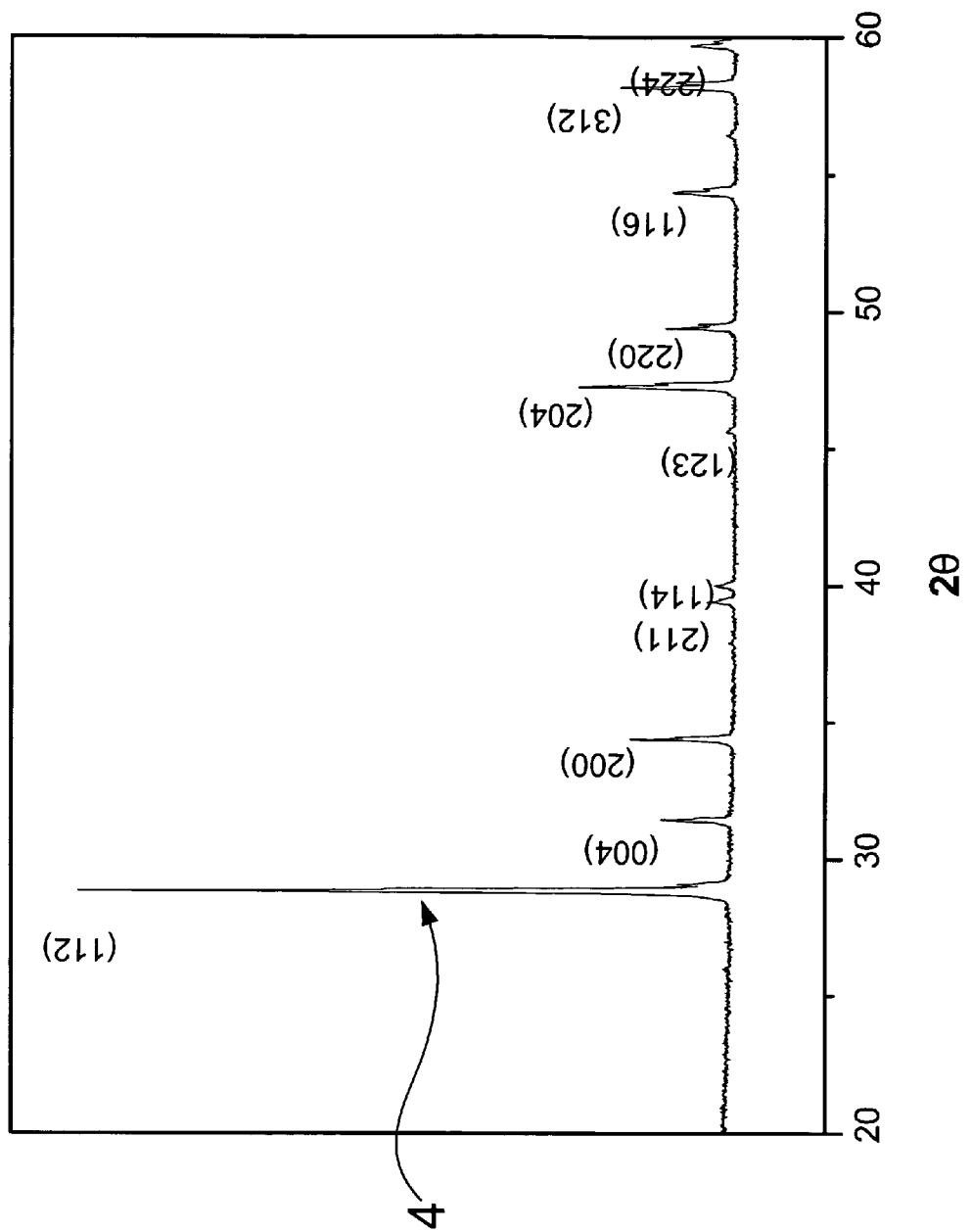
FIG. 4 is a view showing the X-ray diffraction of the phosphor of the preferred embodiment.

Please refer to FIG. 4, which is a view showing the X-ray diffraction of the phosphor of the preferred embodiment. As shown in the figure, the present invention is processed with an X-ray diffraction. From the diagram 4 obtained after the X-ray diffraction, it shows that the phosphor of the present invention has a pure-phase structure.

Figure 5:
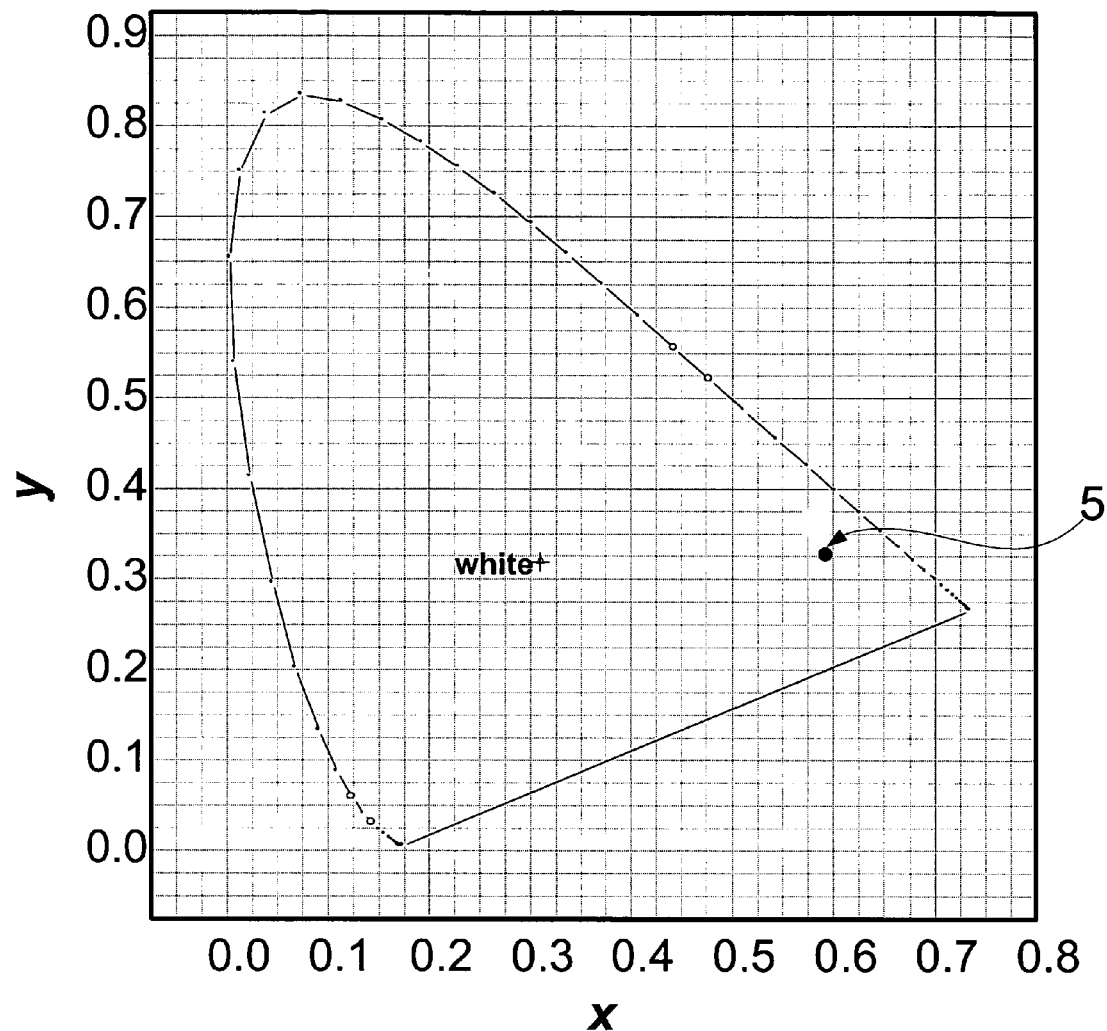
FIG. 5 is a view showing the chromaticity coordinates of the phosphor of the preferred embodiment translated from FIG. 3.

Please refer to FIG. 5, which is a view showing the chromaticity coordinates of the phosphor of the preferred embodiment translated from FIG. 3. As shown in the figure, a chromaticity coordinates 5 of the phosphor of the preferred embodiment, which is (0.5947, 0.3250), is shown by translating the emitting spectrum of the preferred embodiment shown in FIG. 3. Consequently, it shows that the present invention is a red phosphor for emitting a red light.

To sum up, the present invention is a red phosphor for white light emitting diodes, where the phosphor is fit for an excitation by a broadband of wavelength and has an excellent luminance.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A red phosphor for white light emitting diodes, said phosphor having a chemical formula of $A_{1-x-y-z}Bi_xB_yC_zMoO_4$, wherein A for $A_{1-x-y-z}$ is selected from a group consisting of Ca, Sr and Ba;

wherein B for $B_y$ is selected from a group consisting of Li, Na and K;

wherein C for $C_z$ is selected from a group consisting of Eu, Sm, Ce, Mn, Ti, Mg, Zn and Tb;

wherein x is greater than 0 and not greater than 0.2;

wherein y is greater than 0 and not greater than 0.4; and wherein z is greater than 0 and not greater than 0.4.

2. The phosphor according to claim 1, wherein said phosphor is excited by a light source having a wavelength between 290 nanometers (nm) and 400 nm.

3. The phosphor according to claim 1, wherein said phosphor is synthesized through a solid-state reaction.

4. The phosphor according to claim 3, wherein said solid-state reaction comprises steps of:

(a) obtaining materials of $Eu_2O_3$, $MoO_3$, $CaCO_3$, $Li_2CO_3$ and $Bi_2O_3$ to obtain an uniform mixture conforming to a stoichiometric ratio after being ground;

(b) putting said mixture into a crucible to be calcined at a temperature raising ratio of 5 Celsius degrees per minute (° C./min) until arriving at 500 Celsius degrees (° C.) to obtain a first sinter;

(c) after four hours, cooling down said first sinter at a temperature lowering ratio of 5° C./min until arriving at a room temperature to be ground;

(d) obtaining said ground sinter to be calcined at a temperature raising ratio of 5° C./min until arriving at 880° C. to obtain a second sinter; and (e) after four hours, cooling down said second sinter at a temperature lowering ratio of 5° C./min until arriving at a room temperature to be ground to obtain said phosphor having a chemical formula of $Ca_{0.45}Bi_{0.05}Li_{0.25}Eu_{0.25}MoO_4$.

5. The phosphor according to claim 1, wherein said phosphor is synthesized through a chemical synthesis.

6. The phosphor according to claim 5, wherein said chemical synthesis is a precipitation method.

7. The phosphor according to claim 5, wherein said chemical synthesis is a citric gel method.

* * * * *